(12) United States Patent
Schlesser et al.

(10) Patent No.: US 7,678,195 B2
(45) Date of Patent: Mar. 16, 2010

(54) SEEDED GROWTH PROCESS FOR PREPARING ALUMINUM NITRIDE SINGLE CRYSTALS

(75) Inventors: Raoul Schlesser, Cary, NC (US); Vladimir Noveski, Chandler, AZ (US); Zlatko Sitar, Raleigh, NC (US)

(73) Assignee: North Carolina State University, Raleigh, NC (US)

( * ) Notice: Subject to any disclaimer, the term of this patent is extended or adjusted under 35 U.S.C. 154(b) by 933 days.

(21) Appl. No.: 11/399,713

(22) Filed: Apr. 6, 2006

(65) Prior Publication Data

US 2007/0257333 A1 Nov. 8, 2007

Related U.S. Application Data

(60) Provisional application No. 60/669,254, filed on Apr. 7, 2005.

(51) Int. Cl.
*C30B 23/00* (2006.01)
(52) U.S. Cl. .............. 117/94; 117/84; 117/88; 117/90; 117/97; 117/106; 117/952
(58) Field of Classification Search ........... 117/84, 117/88, 90, 94, 97, 106, 952
See application file for complete search history.

(56) References Cited

U.S. PATENT DOCUMENTS

| | | | |
|---|---|---|---|
| 3,352,951 A | 11/1967 | Sara | |
| 4,519,966 A | 5/1985 | Aldinger et al. | |
| 5,368,812 A | 11/1994 | Calka et al. | |
| 5,993,545 A | 11/1999 | Lupton et al. | |
| 6,086,672 A * | 7/2000 | Hunter | 117/84 |
| 6,296,956 B1 | 10/2001 | Hunter | |
| 6,719,843 B2 | 4/2004 | Schowalter et al. | |
| 2002/0170490 A1 | 11/2002 | Vodakov et al. | |

(Continued)

FOREIGN PATENT DOCUMENTS

JP 06183897 A * 7/1994

(Continued)

OTHER PUBLICATIONS

Patent Abstracts of Japan. English Abstract and Computer translation of JP 06-183897 (1994).*

(Continued)

*Primary Examiner*—Robert M Kunemund
*Assistant Examiner*—Matthew J Song
(74) *Attorney, Agent, or Firm*—Alston & Bird LLP (57) ABSTRACT

A method of growing bulk single crystals of an AlN on a single crystal seed is provided, wherein an AlN source material is placed within a crucible chamber in spacial relationship to a seed fused to the cap of the crucible. The crucible is heated in a manner sufficient to establish a temperature gradient between the source material and the seed with the seed at a higher temperature than the source material such that the outer layer of the seed is evaporated, thereby cleaning the seed of contaminants and removing any damage to the seed incurred during seed preparation. Thereafter, the temperature gradient between the source material and the seed is inverted so that the source material is sublimed and deposited on the seed, thereby growing a bulk single crystal of AlN.

11 Claims, 5 Drawing Sheets

U.S. PATENT DOCUMENTS

2005/0166833 A1* 8/2005 Norikane et al. ............ 117/81
2005/0178315 A1* 8/2005 Helava et al. ................ 117/13
2005/0223967 A1 10/2005 Schowalter et al.

FOREIGN PATENT DOCUMENTS

WO WO-2005/012602 A1 2/2005

OTHER PUBLICATIONS

Wu et al ("Growth Kinetics and thermal stress in AlN bulk crystal growth"), Journal of crystal growth 253 (2003) p. 326-339.*
Dalmau et al., "Crucible Selection in AlN Bulk Crystal Growth," *Mater. Res. Symp. Proc.*, 2004, pp. 1-5.
Kislyi et al., "Sintering Kinetics of Tantalum Carbide," *Powder Metallurgy and Metal Ceramics*, 1982, vol. 21(10), pp. 765-767.
Noveski et al., "Mass Transfer in AlN Crystal Growth at High Temperatures," *J. Cryst. Growth*, 2004, vol. 264, pp. 369-378.
Noveski et al., "Seeded Growth of Bulk AlN Crystals and Grain Evolution in Polycrystalline AlN Boules," *J. Cryst. Growth*, 2005, vol. 279, pp. 13-19.
Noveski et al., "Vapor Phase Transport of AlN in an RF Heated Reactor: Low and High Temperature Studies," *Mat. Res, Soc. Symp. Proc.*, 2004, vol. 798, pp. Y2.8.1-Y2.8.6.
Raghothamachar et al., "Synchrotron White Beam Topography Characterization of Physical Vapor Transport Grown AlN and Ammonothermal GaN," *J. Cryst. Growth*, 2002, vol. 246, pp. 271-280.
Schlesser et al., "Bulk Growth of AlN Single Crystals," International Workshop on Bulk Nitride Semiconductors III, Zakopane, Poland, Sep. 4-9, 2004.
Schlesser et al., "Crucible Materials for Growth of Aluminum Nitride Crystals," *J. Cryst. Growth*, 2005, vol. 281, pp. 75-80.
Schlesser et al., "Growth of AlN Bulk Crystals from the Vapor Phase," *Mat. Res. Soc. Symp. Proc.*, 2002, vol. 693, pp. I9.4.1-I9.4.6.
Schlesser et al., "Seeded Growth of AlN Bulk Single Crystals by Sublimation," *J. Cryst. Growth*, 2002, vol. 241, pp. 416-420.
Sitar et al., "Growth of AlN Crystals by Vaporization of Al and Sublimation of AlN Powder," IPAP Conference Series 4, Proceedings of $21^{st}$ Century COE Joint International Workshop on Bulk Nitrides, Jun. 15, 2004.
Strassburg et al., "The Growth and Optical Properties of Large, High-Quality AlN Single Crystals," *J. Appl. Phys.*, 2004, vol. 96(10), pp. 5870-5876.
Zhuang et al., "Grain Expansion and Subsequent Seeded Growth of AlN Single Crystals," *Mater. Res. Soc. Symp. Proc.*, 2005, vol. 831, pp. E11.1.1-E11.1.6.

* cited by examiner

SEEDED GROWTH PROCESS FOR PREPARING ALUMINUM NITRIDE SINGLE CRYSTALS

CROSS REFERENCE TO RELATED APPLICATIONS

This application claims the benefit of U.S. Provisional Application No. 60/669,254, filed Apr. 7, 2005, which is incorporated herein by reference in its entirety and for all purposes.

FEDERALLY SPONSORED RESEARCH OR DEVELOPMENT

The research underlying this invention was supported in part with funds from Office of Naval Research (ONR) grant no. N00014-01-1-0716. The United States Government has certain rights in this invention.

FIELD OF THE INVENTION

The invention relates to a physical vapor transport process for growing bulk crystals of aluminum nitride having single crystalline structure using a single crystal aluminum nitride seed.

BACKGROUND OF THE INVENTION

The wide direct bandgap (6.2 eV), high thermal conductivity (3.2 W/cmK), and high electron drift velocity of aluminum nitride (AlN) make it an excellent candidate for high-power, high-frequency electronic and deep-UV optoelectronic devices. Group III-nitrides grown on sapphire and SiC substrates are commercially available. However, the rather severe mismatch between the aforementioned substrates and overgrown active layers limits device lifetime and performance.

The use of native substrates, such as crystalline AlN wafers, in the group III-nitride (III-N) device fabrication process will reduce the dislocation density in the overgrown films below 1000 cm$^{-2}$ and drastically improve both device performance and lifetime. Bulk growth of III-N crystals is challenging due to the process thermodynamics and extreme operating conditions. AlN or gallium nitride (GaN) single crystals of sizes suitable for substrate applications are not available.

The sandwich-sublimation technique is very promising for growth of large AlN crystals. Self-seeded growth and seeded growth on AlN seeds by powder sublimation has been shown to induce minimal stresses and, hence, nearly dislocation-free crystals can be achieved. In vertical cross-sections of a polycrystalline, self-seeded AlN boule, a gradual grain expansion has been observed in the growth direction. A number of consecutive growth runs are needed to achieve a large single crystalline AlN by grain expansion starting with a polycrystalline material. However, secondary nucleation has been identified as a major issue when growing on AlN seed crystals that have been exposed to air or cut and polished. In addition, oxygen is a very common impurity in AlN crystals. It has a significant influence on the electrical, optical, and thermal properties of the material. For example, oxygen acts as a deep donor and is thought to induce broad absorption bands in the range of 3.5 to 4.5 eV. Oxygen concentration must be minimized for fabrication of high-quality, AlN-based optoelectronic and electronic devices. The effect of oxygen and other impurities on the growth of AlN by physical vapor transport (PVT) is increasingly discussed in the art.

As noted above, secondary nucleation has been a major issue in the growth of bulk AlN on single crystalline AlN seeds that have been previously cut/polished or exposed to air. Secondary nucleation may result for several reasons, including low temperature deposition during ramp-up to the growth conditions and the presence of surface oxide and surface damage caused by cutting and polishing the seed. Impurities that originate from the source and the growth atmosphere can also enhance secondary nucleation. At low temperatures, such as 1700-1800° C., in the PVT growth of bulk AlN by powder sublimation in nitrogen atmosphere, randomly oriented AlN containing Al—O—N is deposited in the form of a white polycrystalline material. It is believed that in this temperature range, oxygen-assisted transport of Al species takes place and AlO and Al$_2$O exist in the gas phase. Oxygen atoms may originate from the powder source and/or the growth environment. Furthermore, an excess of Al in the powder source promotes an early supersaturation of Al species at a lower temperature because of the lower activation energy for breaking Al—Al bonds as compared to Al—N bonds. Supersaturation of Al can further result in a fast, low temperature deposition of Al with impurities by similar mechanism as oxygen-assisted transport through intermediate species in the vapor phase. As noted above, the presence of a surface oxide on AlN seeds would affect the ordering of adatoms and possibly result in random growth direction. These provide a number of defective positions with minimum energy that act as nucleation sites and hence promote random nucleation.

There is a need in the art for a physical vapor transport process that produces bulk single crystal AlN using an AlN seed material in which seed surface contamination is removed and the crystallinity of the seed is reproduced in the growing crystal.

BRIEF SUMMARY OF THE INVENTION

The present invention provides a method of growing bulk single crystals of AlN or alloys containing AlN (e.g., AlGaN or AlN—SiC alloys) on a single crystal seed, preferably an AlN seed, using a physical vapor transport process characterized by an in situ seed cleaning/conditioning step capable of removing contaminants on the exposed surface of the seed, as well as removing surface and sub-surface damage caused by cutting, grinding, or polishing during the seed fabrication process. The seed conditioning process involves establishing a temperature gradient between the source material and the seed wherein the seed is maintained at a higher temperature, thereby facilitating evaporation of an outer layer of the seed while preventing deposition of the source material onto the damaged or contaminated surface of the seed. The invention also provides a method for firmly affixing a seed to a crucible cap without using high temperature glues or binders or mechanical clamping structures, which can introduce sources of contamination into the process and which fail to provide maximal thermal contact between the seed and the crucible cap.

In one aspect, the invention provides a method of growing bulk single crystals of AlN on a single crystal AlN seed. A crucible is used in the process, the crucible comprising a crucible body defining an open-ended chamber and a removable cap adapted for closing the open end of the chamber. The AlN seed is fused to a surface of the cap that is adapted to face the interior of the crucible chamber. An AlN source material is placed within the crucible chamber in spaced relation to the seed fused to the cap. Thereafter, the crucible is heated in a manner sufficient to establish a temperature gradient between the AlN source material and the seed, wherein the seed is at a higher temperature than the source material. In this manner, an outer layer of the seed material is evaporated, which serves to remove contaminants from the seed and repair surface damage that may have occurred during seed preparation. Following the seed conditioning step, the temperature gradient between the source material and the seed is inverted such that a portion of the source material is sublimed and deposited on the seed, thereby growing a bulk single crystal of AlN.

In one preferred embodiment, the temperature gradient maintained during the seed conditioning step is up to about 100° C. per cm of crucible length, meaning that for an exemplary source-to-seed spacing of 1 cm, the difference in temperature between the source material (lower temperature) and the seed (higher temperature) is up to about 100° C. Preferably, the seed conditioning step involves maintaining the temperature gradient for a time sufficient to evaporate an outer layer of the seed having a thickness of at least about 1 μm. Once the temperature gradient is inverted in order to grow the bulk single crystal, the temperature gradient between the source material and the seed is preferably maintained at a value up to about 100° C./cm, meaning the difference in temperature between the source material (higher temperature) and the seed (lower temperature) is up to about 100° C. for an exemplary source-to-seed spacing of 1 cm.

In one further embodiment of the crystal-growing method of the invention, the method comprises providing a crucible comprising a crucible body defining an open-ended chamber and a removable cap adapted for closing the open end of the chamber, wherein an AlN single crystal seed is fused to a surface of the cap adapted to face the interior of the crucible chamber; placing an AlN source material within the crucible chamber in spaced relation to the seed fused to the cap, the distance between the source and the seed being at least about 1 cm. The crucible is heated in a manner sufficient to establish a temperature gradient between the AlN source material and the AlN seed of at least about 5° C./cm, wherein the AlN seed is at a higher temperature than the AlN source material, for a time sufficient to evaporate an outer layer of the AlN seed having a thickness of at least about 1 μm. Thereafter, the temperature gradient between the AlN source material and the AlN seed is inverted such that a portion of the source material is sublimed and deposited on the seed, thereby growing a single crystal of AlN, the temperature gradient being at least about 5° C./cm.

In another aspect, the present invention provides a method of securing an AlN seed to a crucible for use in a crystal growth process. The process involves placing an AlN powder within the crucible chamber and closing the chamber with the removable cap. The AlN source material is sublimed within the crucible and a condensed polycrystalline mass of the AlN is deposited on an internal surface of the crucible chamber. Thereafter, a single crystal AlN seed is placed on a surface of the removable cap facing the interior of the crucible chamber. The crucible chamber is then shut with the removable cap carrying the seed and the crucible is heated to a temperature sufficient to fuse the seed to the crucible cap.

The subliming step preferably comprises heating the crucible in a manner sufficient to establish an axial temperature gradient between the AlN source material and the internal surface upon which the condensed polycrystalline mass is to be deposited. In one embodiment, the subliming step comprises maintaining a temperature gradient of about 30° C./cm between the source material (higher temperature) and the deposition surface (lower temperature). The step used to fuse the seed to the crucible cap preferably involves heating the crucible chamber approximately isothermally, meaning the temperature of the condensed polycrystalline mass and the seed is maintained at approximately the same temperature, although the source material may be maintained at a slightly higher temperature in order to prevent evaporation of the seed during the seed attachment process.

In another aspect, the invention provides a bulk single crystal of AlN prepared according to the above-described process. The bulk crystal grown according to this invention will have a predefined crystallographic orientation equivalent to the crystallographic orientation of the seed material. The bulk AlN single crystal substrate prepared using the method of the invention can be incorporated into AlGaN devices, such as light emitters (e.g., LEDs, laser diodes), light detectors, and high-power and/or high-frequency transistors.

BRIEF DESCRIPTION OF THE DRAWINGS

Having thus described the invention in general terms, reference will now be made to the accompanying drawings, which are not necessarily drawn to scale, and wherein:

DETAILED DESCRIPTION OF THE INVENTION

The present inventions now will be described more fully hereinafter with reference to the accompanying drawings, in which some, but not all embodiments of the inventions are shown. Indeed, these inventions may be embodied in many different forms and should not be construed as limited to the embodiments set forth herein; rather, these embodiments are provided so that this disclosure will satisfy applicable legal requirements. Like numbers refer to like elements throughout.

As used in the specification, and in the appended claims, the singular forms "a", "an", "the", include plural referents unless the context clearly dictates otherwise.

Reference to "single crystal" or "single crystalline" structure refers to a single crystalline form having sufficient long range order to provide substantially isotropic electronic and/or physical properties along each axis of the crystalline structure.

Although the following description of preferred embodiments of the present invention specifies the use of AlN source materials and seeds, the present invention can also be practiced with other source materials and other seed materials known in the art. For example, alloys of AlN such as AlGaN or SiC—AlN could be used as the source material for seeded crystal growth. The AlN or AlN alloy source material can optionally include one or more dopants known in the art, such as beryllium, magnesium, zinc, silicon, germanium, sulfur, oxygen, carbon, hydrogen, or a combination thereof (also known as co-doping). In addition, various alternate seed materials exhibiting a lattice structure that is favorably matched to the desired crystal to be grown can be used. Exemplary seed materials other than AlN include other group III-nitrides or SiC.

The present invention is directed to an integrated seeded growth process for forming large size AlN single crystals using a physical vapor transport process wherein a source material and a seed are spaced apart within a crucible and heated in a manner sufficient to sublime the source material such that the volatilized species are transported from the source to the seed and recondensed on the seed. The method of the invention can be practiced using any high-temperature reactor capable of generating seed growth temperatures in the range of about 1900° C. to 2400° C. In certain embodiments, the reactor should also be capable of operating at a pressure of up to about 1000 Torr. It is crucial that the reactor offer the ability to control the temperature distribution within the reactor. In particular, the reactor must be configured in a manner capable of establishing an axial temperature gradient (e.g., along the symmetry axis of a cylindrical crucible) which can be inverted during the process.

The design of the reactor meeting the above requirements can vary. In an inductively heated reactor, changes in the relative position of the induction coil and the susceptor/crucible induce changes in the top and bottom temperatures of the crucible, and consequently changes in the axial temperature gradient inside the crucible. The relative position of induction coil and crucible may be changed either by means of a mechanism that controllably moves the induction coil in an axial direction, or by means of a mechanism that controllably translates the crucible in an axial direction inside the hot zone of the reactor, or a combination of such mechanisms. In a resistively heated reactor, one method for influencing the temperature gradient inside the crucible involves moving the crucible inside the hot zone of the reactor with an inhomogeneous axial temperature profile. Such a temperature profile may be established by using a concentric heater of limited length, with resulting temperature gradients at the heater boundaries.

Figure 1A:
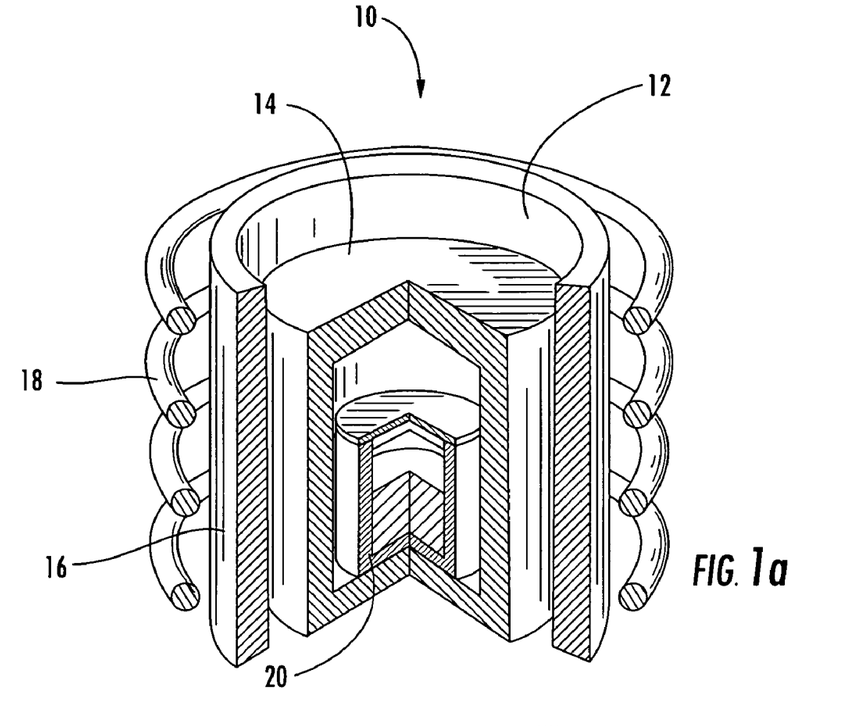
FIG. 1a illustrates a cross-sectional view of an exemplary reactor that can be used in the process of the invention.
Figure 1B:
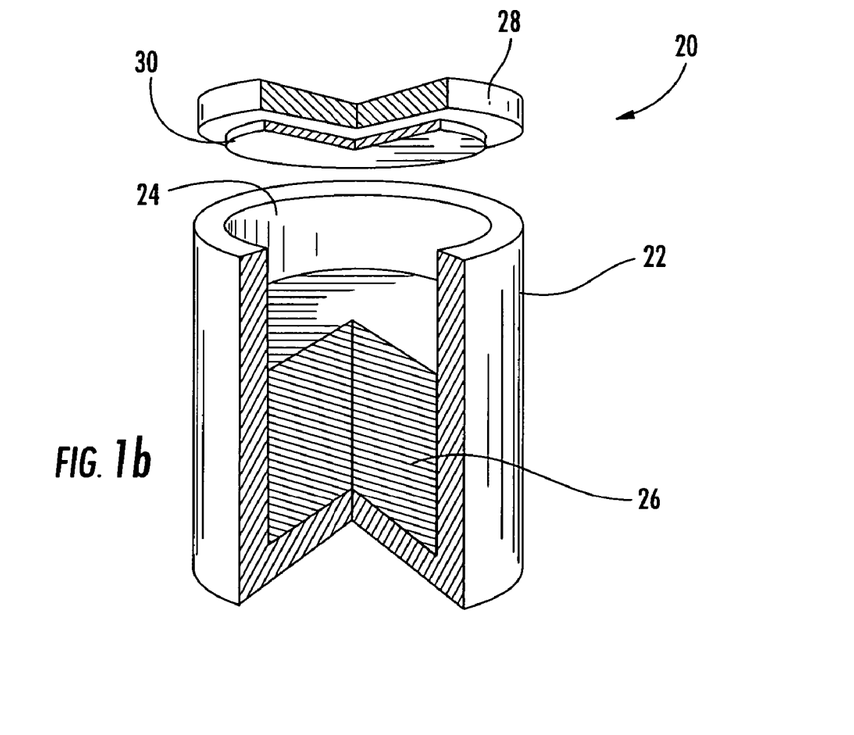
FIG. 1b illustrates a cross-sectional view of an exemplary crucible for use in the present invention.

FIG. 1a illustrates an exemplary RF-heated, water-cooled reactor and FIG. 1b shows an exemplary crucible design. The reactor 10 includes a heating chamber 12 having sufficient size to accommodate the crucible 20. As shown, the reactor 10 includes graphite insulation 14 surrounding the heating chamber 12. Further, the reactor 10 includes a double-walled quartz tube 16 surrounding the insulation 14 and an inductive coil 18 encapsulating the double-walled quartz tube. Although not shown in FIG. 1a, as noted above, the reactor design includes a mechanism for changing the relative position of the induction coil and the crucible in order to establish an axial temperature gradient.

Figure 7:
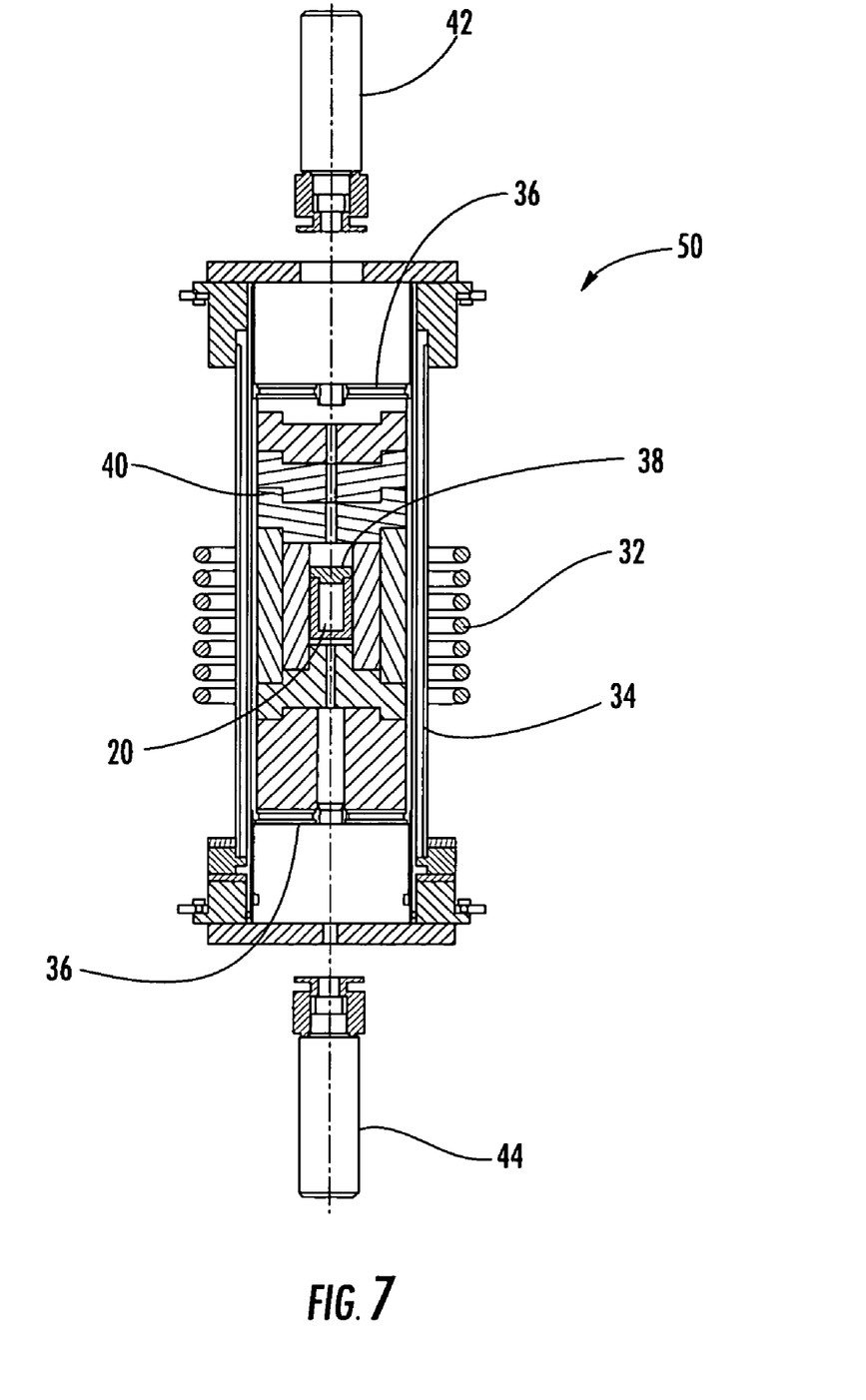
FIG. 7 is a cross sectional view of another exemplary reactor for use in the process of the invention.

FIG. 7 also illustrates an exemplary reactor design for use in the process of the invention. The reactor 50 is inductively heated by a coil 32 powered by an inverter (not shown), such as an air-cooled, 10 kHz RF inverter available from Mesa Electronics, and features a double-wall, water-cooled quartz tube 34 to extract heat in the radial direction at the perimeter of the reactor. The reactor 50 also includes cooling baffles 36 at the top and bottom of the heating chamber 38, through which chilled water can flow to extract heat from the top and bottom of the heating chamber in an axial direction. Thick graphite insulation 40 is located within the reactor 50 in order to minimize radial temperature gradients within the crucible 20. The thickness of the insulation 40 at the top and bottom of the heating chamber 38, and the relative position of the coil 32, can be used to provide the desired temperature gradients needed to practice the method of the invention. Two IR pyrometers, 42 and 44, are positioned to measure the top temperature ($T_t$) and the bottom temperature ($T_b$), respectively, of the crucible 20. The inner quartz tube can be mounted using double O-ring seal assemblies to reduce oxygen contamination, the volume between the O-rings either being evacuated by means of a vacuum pump or being flushed by a steady stream of a gas inert to the crystal growth process. Process gas, typically nitrogen or a mixture of nitrogen/hydrogen/argon, can flow upward inside the inner quartz tube. A mass flow controller (not shown) can control the gas flow rate and an electronic upstream pressure controller (not shown) can be used to keep reactor pressure constant. Temperature can be controlled either passively using a feed forward power control or actively using IR pyrometer signals as process variables in a feedback power control scheme (not shown).

Referring back to FIG. 1b, an exemplary crucible 20 for use in the present invention includes a crucible body 22 defining an open-ended chamber 24 wherein a source material 26 may be placed. As shown, the chamber 24 is defined by the wall surface and the bottom surface of the crucible body 22. The crucible 20 further includes a removable cap 28. As shown, a seed 30 is fused to the cap 28 during the practice of the present invention. Although a cylindrical shape is illustrated in FIG. 1b, other crucible shapes can be used without departing from the present invention. Typically, crucibles used in the method of the invention will have a height of about 1 to about 10 inches (e.g., about 1 to about 5 inches), a wall thickness of about 1/16 to about 5/8 inch (e.g., about 1/8 to about 1/4 inch), and a width or outer diameter of about 3/4 to about 5 inches (e.g., about 1 to about 5 inches).

A preferred crucible used in the method of the invention is constructed of tantalum carbide (TaC). Preferred TaC crucibles are prepared in a two-step sintering process, wherein the first step involves sintering a TaC powder contained in a mold approximating the final desired crucible shape at a temperature of about 1500 to about 1700° C. and with an applied uni-axial pressure of at least about 50 MPa. The resulting green is less than about 80% dense and can be machined as desired prior to a final sintering step conducted at a temperature of about 2300° C. and a pressure of about 1 atm. Crucibles made of other carbides or nitrides of refractory metals could also be prepared using a similar process, such as niobium carbide, hafnium carbide, tantalum nitride, niobium nitride, hafnium nitride, and alloys thereof. Exemplary crucibles are set forth in U.S. Appl. No. 60/668,744, filed Apr. 6, 2005, which is incorporated herein by reference in its entirety and for all purposes.

Figure 2:
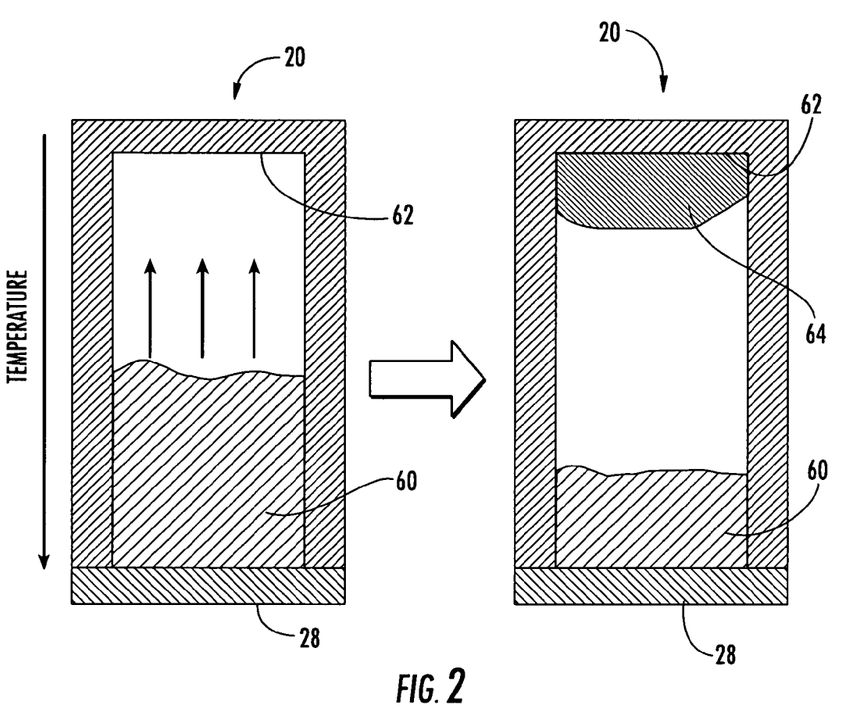
FIG. 2 is a schematic representation of an exemplary embodiment of a method of attaching a condensed polycrystalline mass to the bottom of a crucible by sublimation of a source material using an axial temperature gradient.

The process of the invention will now be described with reference to FIGS. 2-6. It is preferable to evacuate the reactor before each process step to a base pressure of less than about $10^{-5}$ Torr to reduce potential contaminants. In a first step, an AlN source material 60, such as AlN powder, is sublimed into the bottom portion of a crucible 20 as shown in FIG. 2. The sublimed material condenses into a solid polycrystalline mass 64 that adheres to the bottom surface 62 of the crucible 20. For example, as shown, this step can be accomplished by placing the crucible in an inverted position on top of the cap 28, with the AlN source material 60 positioned on top of the cap. During this step, the crucible 20 is heated in a nitrogen gas atmosphere to an elevated temperature of about 2000 to about 2300° C., more preferably about 2200° C. An axial temperature gradient is established between the bottom surface 62 of the crucible 20 where the source material 60 will be deposited and the source material itself, with the source material kept at the higher temperature. Typical temperature gradients between the deposition area and the source material 60 are on the order of at least about 30° C./cm, although temperature gradients of about 1° C./cm to about 100° C./cm could be used without departing from the invention. The purpose of this step is to form a polycrystalline mass 64 that is firmly attached to the bottom of the crucible 20.

Figure 3:
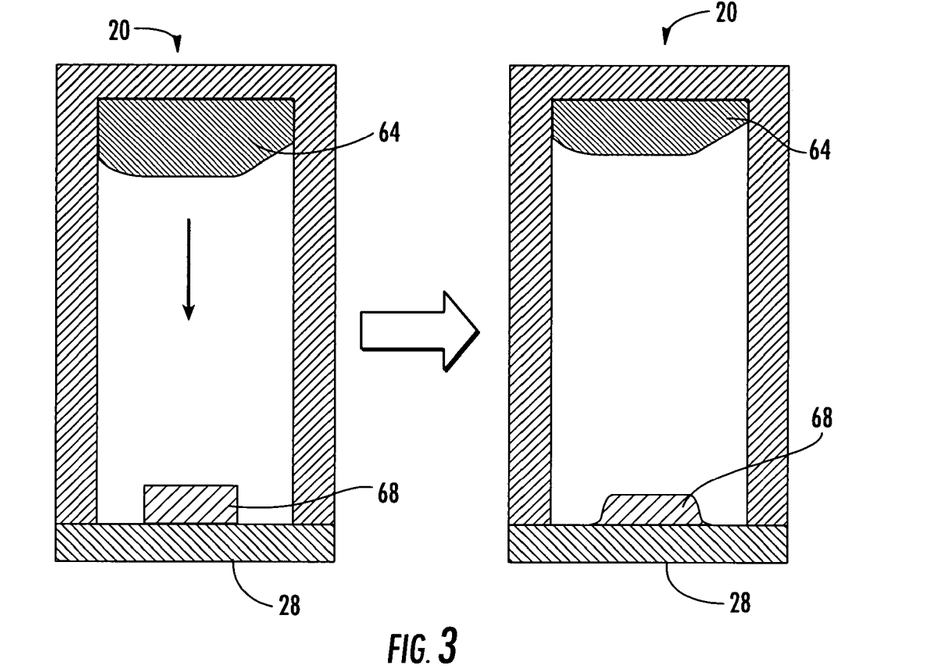
FIG. 3 is a schematic representation of an exemplary embodiment of a method of fusing a seed to a crucible cap.

Thereafter, as shown in FIG. 3, a seed 68 is affixed to the crucible cap 28. Seed affixation is important because the seed 68 is preferably located at the top of the crucible 20, suspended below the crucible cap 28, and because the seed needs to be in good thermal contact with the crucible cap during crystal growth. As shown in FIG. 3, using the method of the invention, the seed 68 can be firmly attached to the crucible cap 28 without using any high temperature glues or mechanical clamping structures as known in the prior art, thus eliminating these potential sources of contamination and maximizing the thermal contact between the seed and the cap. The polycrystalline mass 64 formed in the previous step is suspended above a single crystal seed 68, which is placed on the crucible cap 28. The crucible 20 is heated in a nitrogen-containing gas atmosphere to elevated temperatures in the range of about 1800 to about 2400° C., preferably about 2200° C., under approximately isothermal conditions, meaning all regions within the crucible are maintained at approximately the same temperature, although the source material 64 may be kept at a slightly higher temperature than the seed 68 in order to prevent seed evaporation during the seed attachment process. If a small gradient exists, it is typically no more than about 10° C./cm, and often no more than about 5° C./cm, with the source material 64 being at the higher temperature. Through recrystallization in the narrow gap between the seed 68 and the crucible cap 28, as well as around the edge of the seed, the seed forms an intimate bond with the crucible cap during this heating step. Typically, the crucible 20 is maintained at the approximately isothermal temperature for a period of about 30 minutes to about 3 hours depending on the temperature and the size of the seed 68. The reactor is typically kept at a pressure of about 200 to about 1000 Torr, and preferably at a pressure of about 800 Torr.

Figure 4:
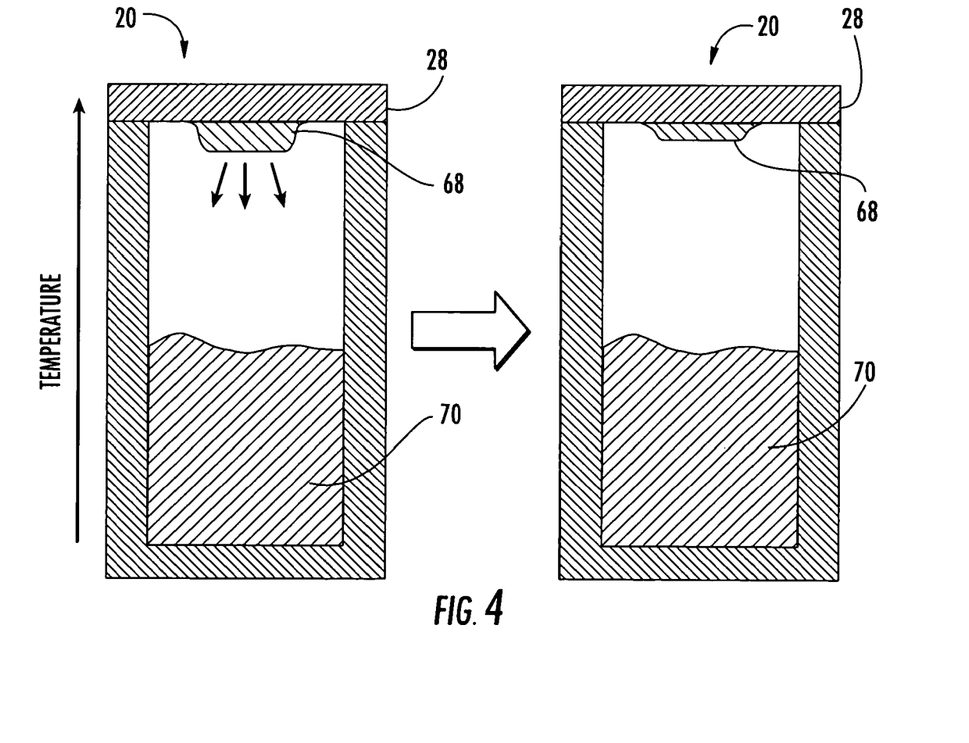
FIG. 4 is a schematic representation of an exemplary embodiment of the method step of establishing a temperature gradient between the source material and the seed during a seed conditioning step.

Following fusing of the seed 68 to the crucible cap 28, the crucible 20 can once again be inverted and an AlN source material 70 can be placed within the chamber of the crucible 20 as shown in FIG. 4. The source material 64 from the seed fusing step illustrated in FIG. 3 can be supplemented with additional source material and pre-sintered to form the source material 70 used in the process step illustrated in FIG. 4. Alternatively, the source material 64 used in the seed fusing step can be removed and replaced with completely new source material. The AlN source material 70 can be a commercially available powder or a pre-sintered AlN source formed in a separate process. A powder source can be pre-sintered by exposing the source material to temperatures above 2000° C. in order to drive off any excess Al and ensure a stoichiometric ratio of Al and N atoms. During the sintering process, oxygen and other contaminants with comparatively high equilibrium vapor pressures will also be significantly reduced as compared to the commercially available powder.

The shape of the source material 70 may vary without departing from the present invention. The source material 70 can be shaped in a manner identical to the inner dimensions of the lower portion of the crucible 20 (e.g., in the shape of a solid cylinder), or the source may have any other shape that fits into the inner dimensions of the crucible chamber, such as hollow cylinders, porous shapes and the like.

Sufficient AlN source material 70 is preferably placed in the crucible 20 to create a gap or space between the source and the seed of about 1 mm to about 5 cm, more preferably about 1 cm to about 3 cm. Once the crucible 20 is loaded with the source material, any oxygen present in the reactor is purged by evacuation and subsequent refilling of the reactor with a nitrogen-containing process gas or inert gaseous atmosphere.

In order to enable epitaxial growth on the seed surface, and to prevent unwanted, randomly oriented growth, it is essential that the seed surface be free of contaminants and/or surface and subsurface damage resulting from cutting, grinding, or polishing procedures used during the seed fabrication process. Attempting to directly grow crystals on an AlN surface that has been exposed to air will not yield single crystalline structure due, in part, to the presence of a thin oxide layer which spontaneously forms upon exposure to air.

The in situ seed conditioning process of the present invention, which is shown in FIG. 4, is capable of completely removing any contaminants and surface/subsurface damage through high-temperature evaporation of seed material in an inverted temperature gradient, meaning the seed 68 is kept at a higher temperature than the source material 70. In this manner, no net crystal growth occurs at the location of the seed 68 before the seed surface is cleaned and recrystallized. The duration of the seed conditioning step, as well as the process temperature, process pressure, and magnitude of the axial temperature gradient determine the amount of seed material that is removed. If mechanical damage to the seed surface or subsurface must be removed, more seed material needs to be evaporated. Typically, the seed conditioning process involves evaporation of at least about 10 µm of seed thickness. In some embodiments, a seed thickness of about 1 to about 500 µm is removed during this step. For removal of a surface oxide layer, evaporation of about 1 to about 10 µm of seed thickness is typical. For removal of subsurface damage to the seed, evaporation of about 100 µm of seed thickness or more is typical. Process temperatures are preferably in the range of about 2000 to about 2300° C., with the axial temperature gradient between the source material and the seed being in the range of approximately isothermal to about 100° C./cm, with a preferred temperature gradient of about 5 to about 30° C./cm. The duration of the cleaning step can vary, but is typically in the range of about 15 minutes to about 2 hours. The total reactor pressure may vary, but is typically in the range of about 100 Torr to about 1000 Torr. A preferred reactor pressure is about 500 Torr.

As noted previously, the seed cleaning/conditioning step can be used with a wide variety of seed materials, as well as a wide variety of seed crystal shapes, including AlN single crystals with natural growth habits, plates or wafers fabricated from previously grown AlN single crystals, and seeds with larger axial extent (e.g., cylindrical seeds with a large range of length/diameter ratio). However, the seed 68 should be sufficiently thick in all dimensions so as not to completely evaporate during the cleaning process. Typically, a minimum thickness of about 100 µm is preferred.

Figure 5:
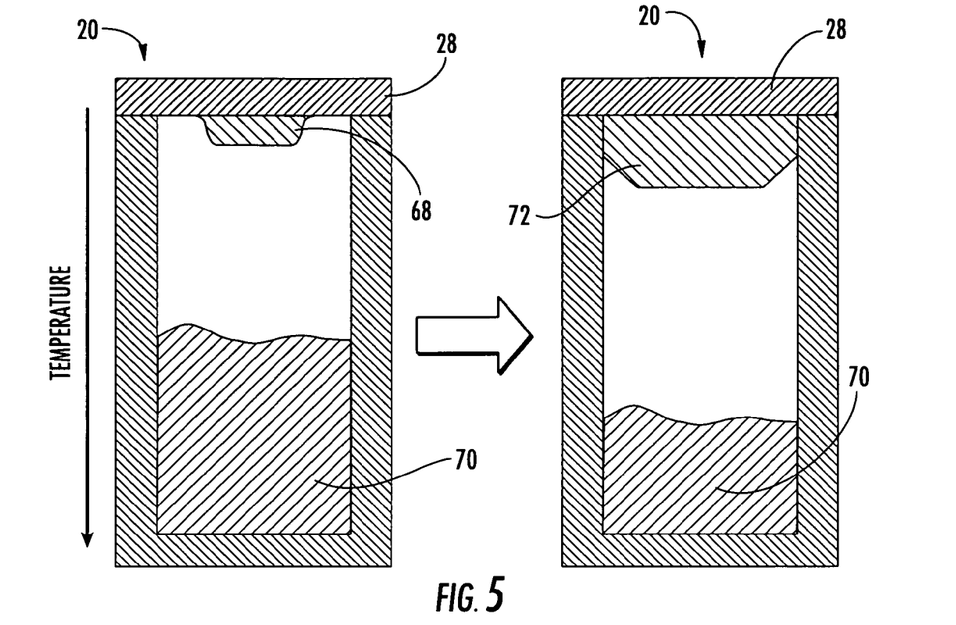
FIG. 5 is a schematic representation of an exemplary embodiment of a single crystal growth method performed by inverting the temperature gradient following the seed conditioning procedure of FIG. 4.

Following the in situ seed conditioning step, the process of the invention may proceed immediately, and without interruption of heating, to crystal growth. No further inversion of the crucible/cap assembly within the reactor is required before commencement of the crystal growth stage of the process. As shown in FIG. 5, during the crystal growth phase of the process, the temperature gradient is inverted as compared to the seed cleaning step. This may be done by changing the temperature field in the reactor hot zone through external controls. For example, this could be accomplished by using a movable RF induction coil or by using one or more auxiliary heaters. Alternatively, the crucible can be physically displaced in a thermally inhomogeneous reactor hot zone. It is important for the transition from the cleaning step to the growth step to be continuous, meaning the temperature of the source material 70 and the seed 68 do not change abruptly during the reversal of the thermal gradient. As would be understood in the art, the deposited crystal material during the seeded growth step will have the same crystallographic orientation as the seed. The single crystal material 72 prepared during the crystal growth step of the method of the invention can be collected and sub-divided for further use.

The same nitrogen-containing atmosphere, reactor pressure and temperature range can be used in the crystal growth phase as identified above with respect to the seed cleaning step. However, instead of the temperature of the seed being higher than the temperature of the source, the direction of the temperature gradient is reversed such that the source material 70 is higher than the temperature of the seed 68. Gradients of the same magnitude as set forth above in reference to the seed conditioning step can be used in the crystal growth phase of the process.

FIG. 5 illustrates only one of various geometries that can be used for the seeded growth step. As previously noted, the source material 70 and the seed 68 can have a variety of shapes. In the exemplary example of FIG. 5, the single crystal grows primarily in an axial direction along the axial temperature gradient. However, the present invention can also be applied to other geometric configurations, such as a long cylindrical seed surrounded by a hollow cylindrical source. In such an embodiment, crystal growth proceeds in a radial direction in the presence of a radial temperature gradient. The principle of an integrated process comprising both in situ seed cleaning by evaporation immediately followed by seeded growth is not limited by any factors other than the ability to establish and control the required temperature gradients.

Figure 6:
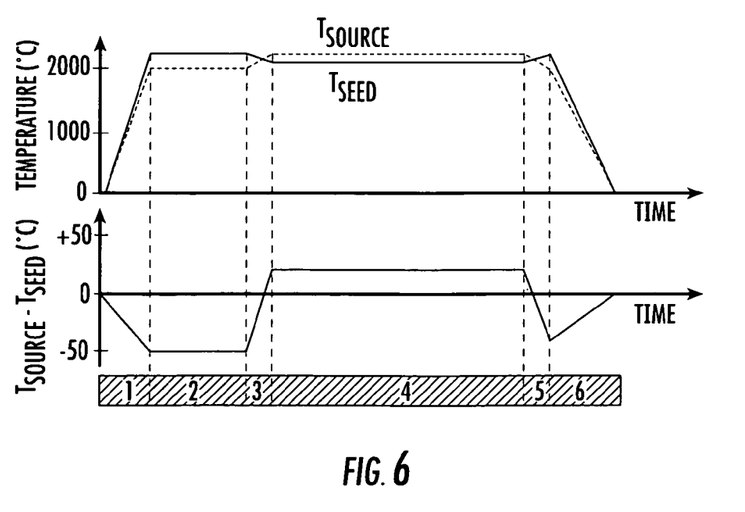
FIG. 6 is a graphical representation of the temperature of the source material and the seed during each phase of an exemplary embodiment of the method of the invention.

FIG. 6 graphically illustrates the changing temperatures of the source material 70 and the seed 68 during the process of the invention. As shown, after initially ramping up the process temperature in Phase 1, an inverted gradient is established for seed cleaning purposes (Phase 2). Upon completion of the seed cleaning step, source 70 and seed 68 temperatures are continuously adjusted during a transition phase (Phase 3) until the temperatures required for growth are reached. The crystal growth period is designated Phase 4 in FIG. 6. Optionally, and in order to interrupt crystal growth in a defined way, the growth gradient may be inverted at the end of growth Phase 4 so that no further unwanted growth occurs during temperature ramp-down. The growth suppression phase is designated Phase 5 in FIG. 6. Preferably, the temperature gradient established during the optional growth suppression phase of the process is about 1 to about 100° C./cm, more preferably about 10 to about 30° C./cm. The cooling period is designated Phase 6 in FIG. 6. Following the cooling period, the reactor can be vented and opened, the crucible 20 retrieved, and the crystal removed from the crucible cap 28.

In the preferred embodiments of the invention described above, the seed 68 is initially fused to the cap 28 of the crucible 20 and the source material 70 is placed at the bottom of the crucible chamber in spaced relation to the crucible cap. However, as will be readily apparent to one of ordinary skill in the art, the relative positions of the seed 68 and the source material 70 could be reversed or otherwise changed within the crucible 20 without departing from the present invention. For example, the seed 68 could be fused to the bottom surface 62 of the interior chamber of the crucible 20 as opposed to the cap 28. In such an embodiment, the crucible 20 is inverted during the seed cleaning and crystal growth phases of the process, with the source material 70 resting on the cap 28 of the crucible. It would be readily appreciated by one of ordinary skill in the art that the exact positions of the seed 68 and source material 70 within the crucible 20 is immaterial to the invention.

The present invention provides a crystal growth method that enables homoepitaxial growth of high quality AlN crystals on AlN seeds of any given crystallographic orientation. The process allows for an integrated conditioning of the AlN seed in situ and at the beginning of the growth process, the conditioning or cleaning process capable of desorbing contaminants from the surface of the seed, as well as removing surface and subsurface damage resulting from prior cutting or polishing of the seed. The present invention also allows for growth process interruptions and consecutive resumption of epitaxial growth on the previous growth front while suppressing unwanted, secondary nucleation that would otherwise adversely affect the crystal quality. Further, the process of the invention enables the preparation of large-size, single crystalline AlN boules through iterative regrowth on previously deposited material without losing the crystallographic relationship between the previously deposited growth and overgrown material. The process of the invention also provides an integrated process route for batch-process boule production during which a slice or wafer cut from a previously grown boule is used as a seed for the growth of the next boule. In contrast to processes that use self-seeded growth schemes, reproducibility and reliability of the seeded crystal growth process of the invention provide a commercially viable route for the fabrication of AlN substrates for the AlN industry.

The AlN wafers made according to the present invention can be used in the semiconductor industry as a next generation native substrate for AlGaN devices. The AlN substrates will have numerous benefits as compared to currently-used SiC or sapphire substrates, since they are nearly perfectly lattice-matched with AlGaN device layers and are, therefore, anticipated to drastically improve device layer quality.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Although specific terms are employed herein, they are used in a generic and descriptive sense only and not for purposes of limitation.

That which is claimed:

1. A method of securing a single crystal seed to a crucible for use in a crystal growth process, the method comprising:

providing a crucible comprising a crucible body defining an open-ended chamber and a removable cap adapted for closing the open end of the chamber;

placing an AlN source material within the crucible chamber;

subliming the AlN source material within the crucible for a time and at a temperature sufficient to deposit a condensed polycrystalline mass of the AlN source material on an internal surface of the crucible chamber;

placing a single crystal seed on a surface of the removable cap facing the interior of the crucible chamber following said subliming step;

closing the open end of the crucible chamber with the removable cap carrying the seed; and heating the crucible chamber containing the condensed polycrystalline mass of AlN source material to a temperature sufficient to fuse the seed to the crucible cap.

2. The method of claim 1, wherein the single crystal seed is an AlN seed.

3. The method of claim 1, wherein said subliming step comprises heating the crucible in a manner sufficient to establish an axial temperature gradient between the AlN source material and the internal surface upon which the condensed polycrystalline mass is to be deposited, the AlN source material being maintained at a higher temperature than the deposition surface.

4. The method of claim 3, wherein said subliming step comprises maintaining a temperature gradient of about 1° C./cm to about 100° C./cm between the AlN source material and the deposition surface.

5. The method of claim 4, wherein said subliming step comprises maintaining a temperature gradient of at least about 30° C./cm between the AlN source material and the deposition surface.

6. The method of claim 1, wherein said heating step comprises heating the crucible chamber approximately isothermally.

7. The method of claim 1, wherein the AlN source material is selected from the group consisting of AlN, AlN alloys, and AlN or AlN alloys including one or more dopants.

8. A method of securing a single crystal seed to a crucible for use in a crystal growth process, the method comprising:
   providing a crucible comprising a crucible body defining an open-ended chamber and a removable cap adapted for closing the open end of the chamber;
   placing an AlN source material within the crucible chamber;
   subliming the AlN source material within the crucible, said subliming step comprising heating the crucible chamber in a manner sufficient to establish an axial temperature gradient between the AlN source material and an internal surface upon which a condensed polycrystalline mass of the AlN source material is to be deposited, the AlN source material being maintained at a higher temperature than the deposition surface, said heating step causing the deposition of a condensed polycrystalline mass of the AlN source material on the internal surface of the crucible chamber;
   placing a single crystal AlN seed on a surface of the removable cap facing the interior of the crucible chamber following said subliming step;
   closing the open end of the crucible chamber with the removable cap carrying the seed; and
   heating the crucible chamber containing the condensed polycrystalline mass of AlN source material approximately isothermally to a temperature sufficient to fuse the seed to the crucible cap.

9. The method of claim 8, wherein said subliming step comprises heating the crucible to a temperature of about 2000 to about 2300° C., the temperature gradient being about 1° C./cm to about 100° C./cm between the AlN source material and the deposition surface.

10. The method of claim 8, wherein said step of heating the crucible chamber approximately isothermally comprises heating the crucible chamber to a temperature of about 1800 to about 2400° C.

11. A method of securing a single crystal seed to a crucible for use in a crystal growth process, the method comprising:
   providing a crucible comprising a crucible body defining an open-ended chamber and a removable cap adapted for closing the open end of the chamber;
   placing an AlN source material on the cap of the crucible with the crucible in an inverted position;
   while maintaining the crucible in an inverted position, subliming the AlN source material within the crucible for a time and at a temperature sufficient to deposit a condensed polycrystalline mass of the AlN source material on an internal surface of the crucible chamber;
   placing a single crystal seed on a surface of the removable cap facing the interior of the crucible chamber with the crucible in an inverted position, the polycrystalline mass of AlN source material being positioned above the seed; and
   while maintaining the crucible in an inverted position, heating the crucible chamber containing the condensed polycrystalline mass of AlN source material to a temperature sufficient to fuse the seed to the crucible cap.

* * * * *